United States Patent
Kim et al.

(10) Patent No.: US 9,577,123 B2
(45) Date of Patent: Feb. 21, 2017

(54) NANOSTRUCTURE AND OPTICAL DEVICE HAVING NANOSTRUCTURE

(71) Applicants: SAMSUNG ELECTRONICS CO., LTD., Suwon-si (KR); UNIST Academy-Industry Research Corporation, Ulsan (KR)

(72) Inventors: Unjeong Kim, Hwaseong-si (KR); Younggeun Roh, Seoul (KR); Jineun Kim, Suwon-si (KR); Soojin Park, Ulsan (KR); Yeonsang Park, Seoul (KR); Chanwook Baik, Yongin-si (KR); Seungmin Yoo, Ulsan (KR); Jaesoong Lee, Suwon-si (KR); Sangmo Cheon, Bucheon-si (KR)

(73) Assignees: SAMSUNG ELECTRONICS CO., LTD., Suwon-si (KR); UNIST (Ulsan National Institute of Science and Technology), Ulsan (KR)

( * ) Notice: Subject to any disclaimer, the term of this patent is extended or adjusted under 35 U.S.C. 154(b) by 1 day.

(21) Appl. No.: 14/535,952

(22) Filed: Nov. 7, 2014

(65) Prior Publication Data

US 2015/0123079 A1 May 7, 2015

(30) Foreign Application Priority Data

Nov. 7, 2013 (KR) .................. 10-2013-0134987

(51) Int. Cl.
*H01L 31/0352* (2006.01)
*H01L 31/028* (2006.01)
*H01L 31/0232* (2014.01)

(52) U.S. Cl.
CPC ...... *H01L 31/02327* (2013.01); *Y10T 428/218* (2015.01); *Y10T 428/24851* (2015.01)

(58) Field of Classification Search
CPC .................. Y10S 977/954; H01L 31/022416; H01L 31/02327; H01L 21/283
See application file for complete search history.

(56) References Cited

U.S. PATENT DOCUMENTS

| 9,029,252 | B2* | 5/2015 | Kim | ............... H01L 31/022416 257/428 |
| 2008/0157235 | A1* | 7/2008 | Rogers | ............... H01L 21/8258 257/415 |
| 2012/0161106 | A1 | 6/2012 | Kim et al. | |
| 2013/0026442 | A1 | 1/2013 | Kim | |
| 2013/0081693 | A1 | 4/2013 | Kaufman | |
| 2014/0225067 | A1 | 8/2014 | Kim et al. | |

FOREIGN PATENT DOCUMENTS

| KR | 10-2009-0016918 A | 2/2009 |
| KR | 10-1335616 B1 | 12/2013 |
| KR | 1020140102566 A | 8/2014 |

\* cited by examiner

*Primary Examiner* — Seahvosh Nikmanesh
(74) *Attorney, Agent, or Firm* — Sughrue Mion, PLLC

(57) ABSTRACT

Provided are nanostructures and optical devices having the nanostructures. The nanostructure may include a carbon nanomaterial layer, a nanopattern formed on the carbon nanomaterial layer, and a metal layer formed on a surface of the nanopattern. The nanostructure may be formed in a ring shape, and the metal layer may include a plurality of metal layers formed of different metals.

14 Claims, 5 Drawing Sheets

NANOSTRUCTURE AND OPTICAL DEVICE HAVING NANOSTRUCTURE

CROSS-REFERENCE TO RELATED APPLICATION

This application claims the benefit of Korean Patent Application No. 10-2013-0134987, filed on Nov. 7, 2013 in the Korean Intellectual Property Office, the disclosure of which is incorporated herein in its entirety by reference.

BACKGROUND

1. Field

Exemplary embodiments relate to nanostructures and optical devices having the nanostructures, and more particularly, to nanostructures that are formed on a carbon nanomaterial layer and have a plasmonic structure, and optical devices having the nanostructure.

2. Description of the Related Art

Various studies have been performed to determine how to apply graphene to electronic devices and optical devices, since a method of synthesizing graphene has been disclosed. Due to not only high stability of electrical, mechanical, and chemical characteristics of graphene, but also high electrical conductivity of graphene, many studies about nanodevices that use graphene have been conducted.

Graphene is a carbon nanomaterial layer having a monoatomic layer in which carbon atoms are connected in a hexagonal shape on a plane. Graphene transmits electricity at a rate which is 100 times greater or more than 100 times greater than a rate of electricity transmission of monocrystal silicon that is mainly used for semiconductor devices, and has a theoretical mobility of 200,000 cm2/Vs. It has been reported that graphene allows electricity to flow at a rate 100 times greater than a rate at which electricity flows for copper, and therefore, graphene has drawn attention as a basic material for electronic circuits.

Due to the advantages of graphene, many studies have been conducted to determine how to apply the graphene to various electronic devices and optoelectronic devices. Also, studies about optical devices that use a photocurrent generated from graphene have been conducted. However, since it is not easy to form various nanostructure patterns on graphene, there are difficulties in manufacturing various devices to which the nanostructure patterns are applied.

SUMMARY

One or more exemplary embodiments provide nanostructures formed on a carbon nanomaterial layer and methods of manufacturing the nanostructures.

One or more exemplary embodiments also provide methods of manufacturing optical devices having the nanostructures formed on a carbon nanomaterial layer.

According to an aspect of an exemplary embodiment, there is provided a nanostructure including: a carbon nanomaterial layer; a nanopattern formed on the carbon nanomaterial layer; and a metal layer coated on a surface of the nanopattern.

The nanostructure may have a ring shape.

The nanopattern may include a plurality of dot-shaped metal particles arranged in a ring shape.

The metal layer may connect the dot-shaped metal particles to form the nanostructure in a continuous structure.

The nanopattern may be formed of Au, Ag, Cu, Cr, Pt, Pd, or an alloy of Au, Ag, Cu, Cr, Pt, Pd.

The metal layer may be formed of Au, Ag, Cu, Cr, Pt, Pd, or an alloy of Au, Ag, Cu, Cr, Pt, Pd.

The metal layer may be formed of a plurality of metals.

The metal layer may include a plurality of metal layers formed of different metals on a surface of the nanopattern.

According to another aspect of an exemplary embodiment, there is provided an optical device including: a carbon nanomaterial layer; a plurality of nanostructures formed on the carbon nanomaterial layer; and a first electrode and a second electrode that contact the carbon nanomaterial layer on which the plurality of nanostructures is formed.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1A:
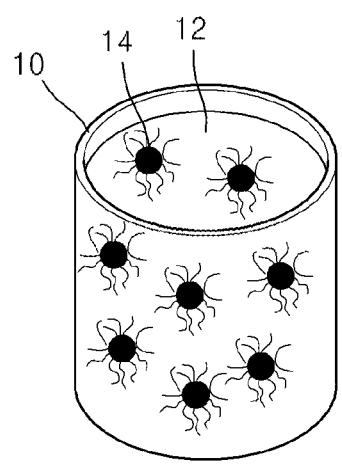
FIGS. 1A, 1B and 1C are perspective views of nanostructures and a method of manufacturing the nanostructures according to an exemplary embodiment.

A nanostructure and an optical device having a nanostructure according to exemplary embodiments will now be described in detail with reference to the accompanying drawings. In the drawings, the thicknesses of layers and regions are exaggerated for clarity. Like reference numerals in the drawings denote like elements throughout the specification.

A nanostructure according to an exemplary embodiment is formed on a carbon nanomaterial layer and may have a ring shape. The carbon nanomaterial layer may include a graphene layer, and the graphene layer may be formed on a lower structure. The lower structure may be a substrate formed of various materials.

Figure 1B:
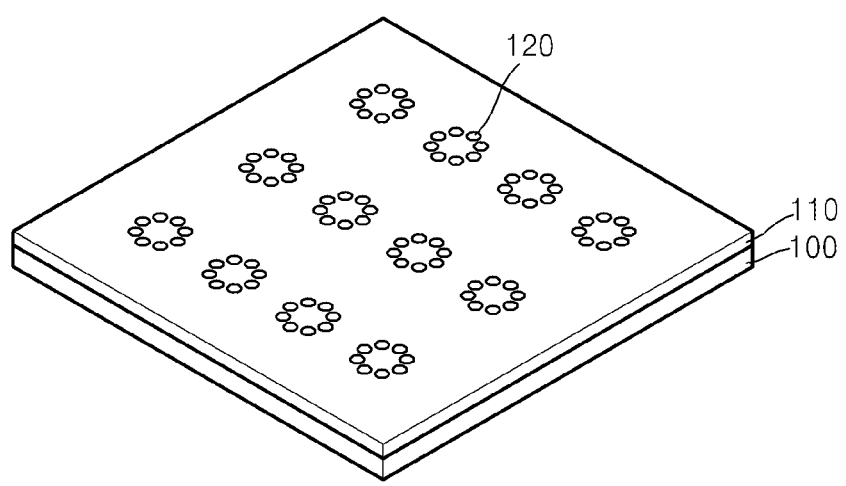
Figure 1C:
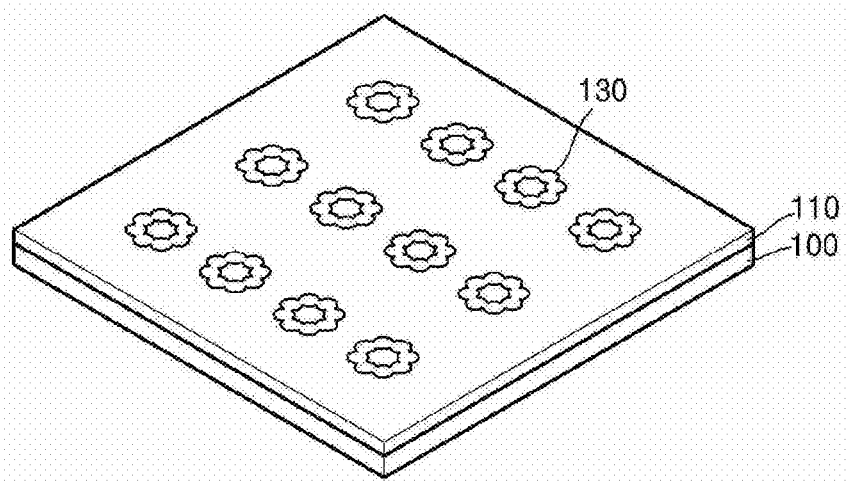

FIGS. 1A, 1B and 1C are perspective views of a nanostructure and a method of manufacturing the nanostructure according to an exemplary embodiment.

Referring to FIG. 1A, in order to form a nanostructure, a polymer solution 12 that includes a block copolymer is prepared in a container 10. The polymer solution 12 is in a state in which the block copolymer is dissolved in a solvent.

The block copolymer may include a hydrophobic first polymer and a hydrophilic second polymer. The block copolymer may be at least one of the following types: polystyrene-block-poly(4-vinylpyridine) (PS-b-P4VP), polystyrene-block-poly(2-vinylpyridine) (PS-b-P2VP), polystyrene-block-poly(ethylene oxide) (PS-b-PEO), polystyrene-block-poly(acrylic acid) (PS-b-PAA), polyisopreneblock-poly(4-vinylpyridine) (PI-b-P4VP), polyisoprene-block-poly(2-vinylpyridine) (PI-b-P2VP), polyisoprene-block-poly(ethylene oxide) (PI-b-PEO), polyisoprene-block-poly(acrylic acid) (PI-b-PAA), poly(methyl methacrylate)-block-poly(4-vinylpyridine) (PMMA-b-P4VP), poly(methyl methacrylate)-block-poly(2-vinyl pyridine) (PMMA-b-P2VP), poly(methyl methacrylate)-block-poly(ethylene oxide) (PMMA-b-PEO), poly(methyl methacrylate)-block-poly(acrylic acid) (PMMA-b-PAA), polystyrene-block-poly(methacrylic acid) (PS-b-PMA), polystyrene-block-poly(methyl methacrylate) (PS-b-PMMA), polyisoprene-block-poly(mechacrylic acid) (PI-b-PMA), polyisoprene-block-poly(methyl methacrylate) (PI-b-PMMA), poly(methyl methacrylate)-block-poly(methacrylic acid) (PMMA-b-PMA), polystyrene-block-poly(hydroxylstyrene) (PS-b-PS—OH), and polyisoprene-block-poly(hydroxylstyrene) (PI-b-PS—OH).

The solvent included in the polymer solution 12 may be a hydrophobic solvent. For example, the solvent may be toluene, a mixed solution of toluene and tetrahydrofuran (THF), xylene, or ethlybenzene. The block copolymer may be added to the solvent at a concentration in a range from about 0.3 to about 1.0 wt %. More specifically, when PS-b-P4VP is used as the block copolymer, the PS-b-P4VP may be dissolved in toluene or in a mixed solution of toluene and THF to a concentration in a range from about 0.3 to about 1.0 wt %. The amount of toluene in the mixed solution of toluene and THF may be in a range from about 50 to about 100 vol %. When PS-b-P2VP is used as the block copolymer, toluene or xylene may be used as the solvent.

The block copolymer may include a hydrophobic first polymer and a hydrophilic second polymer. In the case of PS-b-P4VP, "PS" may be the hydrophobic first polymer and "P4VP" may be the hydrophilic second polymer. In the case of PS-b-P2VP, "PS" may be the hydrophobic first polymer and "P2VP" may be the hydrophilic second polymer. When a block copolymer that includes the first and second copolymers is dissolved in hydrophobic solvent, micelles 14 of the block copolymer may be formed. Each of the micelles 14 may include a core unit that includes the second polymer (for example, PS-b-P4VP or PS-b-P2VP) and a shell unit that includes the first polymer (for example, PS).

Referring to FIG. 1B, a carbon nanomaterial layer 110 is formed on a lower structure 100, and nanopatterns 120 may be formed on the carbon nanomaterial layer 110 by using the polymer solution 12 manufactured in FIG. 1A. The lower structure 100 may be an object on which a nanostructure according to an exemplary embodiment is to be formed, that is, a substrate. The substrate may be a glass substrate or a polymer substrate. Also, the substrate may be a semiconductor substrate, such as a silicon substrate, a conductive substrate of a metal or a conductive metal compound, or an insulating substrate formed of silicon oxide or silicon nitride. Also, the substrate may be transparent, opaque, or semitransparent.

The carbon nanomaterial layer 110 may be formed by including graphene. The graphene may have a sheet structure in which carbon atoms are connected in a plane hexagonal shape. The carbon nanomaterial layer 110 may include one graphene layer or multiple graphene layers. The graphene may be transferred onto the lower structure 100 after being formed on another substrate by chemical vapor deposition (CVD) or pyrolysis, or may be directly formed on the lower structure 100.

In order to form the nanopatterns 120, the polymer solution 12 of FIG. 1A may be coated on the carbon nanomaterial layer 110. For example, the polymer solution 12 may be coated on the carbon nanomaterial layer 110 by using a spin coating process, and the spin coating may be performed at a speed in a range from about 2,000 to about 5,000 rpm. When the polymer solution 12 is coated on the carbon nanomaterial layer 110, a micelle layer of block copolymer may be formed on the carbon nanomaterial layer 110. After forming the micelle layer, a drying process may be performed as an optional process. The drying process may be performed for a few seconds to a few tens of minutes in an $N^2$, Ar, or air atmosphere. Before performing the drying process, the micelle layer may be soaked in ethanol or methanol for a few minutes to a few tens of minutes. When the drying process is completed, the micelle layer may have a porous structure. The reason why the micelle layer of the block copolymer has a porous structure is believed to be that, in the process of soaking the micelle layer, due to an affinity between a polymer in the core region and the solution, the polymer moves from the core region to the outside of the shell region.

Also, after preparing a metal precursor solution, the carbon nanomaterial layer 110 on which the micelle layer is formed may be soaked in the metal precursor solution. The metal precursor solution is formed by adding a predetermined metal precursor in a solvent. The metal may be Au, Ag, Cu, Cr, Pt, Pd, or an alloy of these metals. When the metal is Au, for example, $HAuCl_4$ or $LiAuCl_4$ may be used as a metal precursor. When the metal is Ag, for example, $Ag(ClO_4)$ may be used as the metal precursor. Also, when the metal is Cu, for example, $Cu(NO_3)_2$ may be used as the metal precursor.

A solvent that may be used for the metal precursor solution may be an alcohol group solvent or water. The alcohol group solvent may be, for example, ethanol or methanol. The concentration of the metal precursor in a solvent may be in a range from about 0.01 to about 1.0 wt %. When the carbon nanomaterial layer 110 on which the micelle layer is formed is soaked in the metal precursor solution, the metal precursor may combine with the micelles 14 of the block copolymer. The metal precursor material may combine with the core unit of the micelles 14 of the block copolymer. The core unit of the micelles 14 may each include a functional group to which the metal precursor may combine with, and thus, the metal precursor material may combine with the core unit of the micelles 14 of the block copolymer. As a result, the metal precursor material may be formed on the carbon nanomaterial layer 110 with the same arrangement and pattern type as the core unit of the micelle of the block copolymer.

Next, a metal pattern may be formed by performing a plasma process on a micelle film of the block copolymer and the metal precursor material that are formed on the carbon nanomaterial layer 110. The plasma may be hydrogen ($H_2$) plasma or oxygen ($O_2$) plasma. The plasma process may be performed for a few tens of seconds to a few tens of minutes. Through the plasma processing, the micelle layer of the block copolymer may be removed and the metal precursor material may be reduced. Accordingly, the nanopatterns 120 may be formed by removing the micelle layer of the block copolymer and reducing the metal precursor material. The nanopatterns 120 may be metal nanoparticle patterns in which dot shaped metal particles are arranged in a ring shape. The dots in the nanopatterns 120 may each have a diameter in a range from about a few tens of nm to about a few hundreds of nm. The nanopatterns 120 may have a ring shape on the carbon nanomaterial layer 110. The ring shape denotes an arranged shape of the metal nanodots on the carbon nanomaterial layer 110, and the ring shape may instead be an oval shape or other shapes.

Referring to FIGS. 1B and 1C, nanostructures 130 having a ring shape may be formed by coating a metal material on the nanopatterns 120 formed on the carbon nanomaterial layer 110. The nanostructures 130 may each be formed by connecting the dot shaped nano particles of the nanopatterns 120 in FIG. 1B to each other through an additional metal material coating. The nanopatterns 120 may be formed by arranging dot shaped metal particles, and the metal particles may be discontinuously arranged. Since a metal material is additionally coated onto the nanopatterns 120, the dot shaped metal particles that constitute the nanopatterns 120 may be connected to each other, and thus, a continuous structure may be formed.

In order to additionally coat a metal material onto the nanopatterns 120, various processes may be used. For example, in order to form the nanostructures 130, a plating process may be used. The plating process may use a reducing reaction. Also, an electroless plating process or a chemical plating process may be used. The metal materials to be used for coating the nanopatterns 120 may be, for example, Au, Ag, Cu, Cr, Pt, Pd, or an alloy of these metals. A process of coating the nanopatterns 120 may be performed by soaking precursors of these metals in a plating solution. When the metal is Au, $HAuCl_4$ or $LiAuCl_4$ may, for example, be used as the precursor. When the metal is Ag, Ag $(ClO_4)$ may, for example, be used as the precursor. Also, when the metal is Cu, Cu $(NO_3)_2$ may, for example, be used as the precursor. A metal that forms the nanopatterns 120 may also be referred to as a first metal, and a metal that forms the nanostructures 130 by being coated on the nanopatterns 120 may also be referred to as a second metal. The second metal may be selected according to a wavelength region, having an optical absorbancy which may be confirmed. For example, in the case of the mid-infrared ray (Mid-IR) region, Au, Cu, or Pt may be selected as the second metal. In the case of the ultraviolet ray (UV) region, Ag may be selected as the second metal. The second metal may also be plural metals instead of a single metal. When plural metals are used as the second metal, in the case of an ultra wideband wavelength range from UV ray to infra red ray, a combination of various metals may be used as the second metal. The second metal that is coated onto the nanopatterns 120 may be plural metals, the plural metals may be coated onto the nanopatterns 120 in an alloy state, and a plurality of metal layers respectively formed of the plural metals may be formed on surfaces of the nanopatterns 120. Accordingly, the nanostructures 130 may respectively include a nanopattern 120 inside the nanostructures 130 and a plurality of metal layers coated on the nanopattern 120. If the nanopattern 120 is referred to as a core, the metal layer coated on the nanopattern 120 may be referred to as a shell. Also, when the nanostructure 130 includes a plurality of metal layers formed on the nanopattern 120, inner metal layers may be referred to as a core together with the nanopattern 120 and the metal layer coated outside of the nanopattern 120 may be referred to as a shell.

Figure 2A:
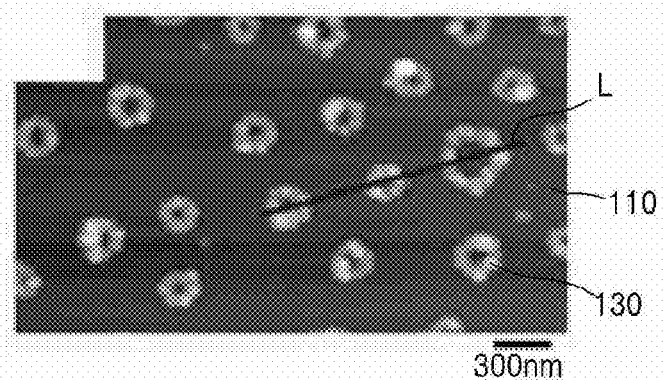
FIG. 2A is an atomic force microscope (AFM) image of an Au layer formed as a nanostructure.

FIG. 2A is an atomic force microscope (AFM) image of an Au layer formed as a nanostructure. According to an exemplary embodiment, a specimen to be observed was formed by performing electroless plating at room temperature for approximately 5 minutes using 0.2% $HAuCl_4$ as a precursor after forming Au dots as nanopatterns on a graphene layer. The AFM image shown in FIG. 2A confirms that the nanostructures 130 are formed in a ring shape on the carbon nanomaterial layer 110 formed of graphene.

Figure 2B:
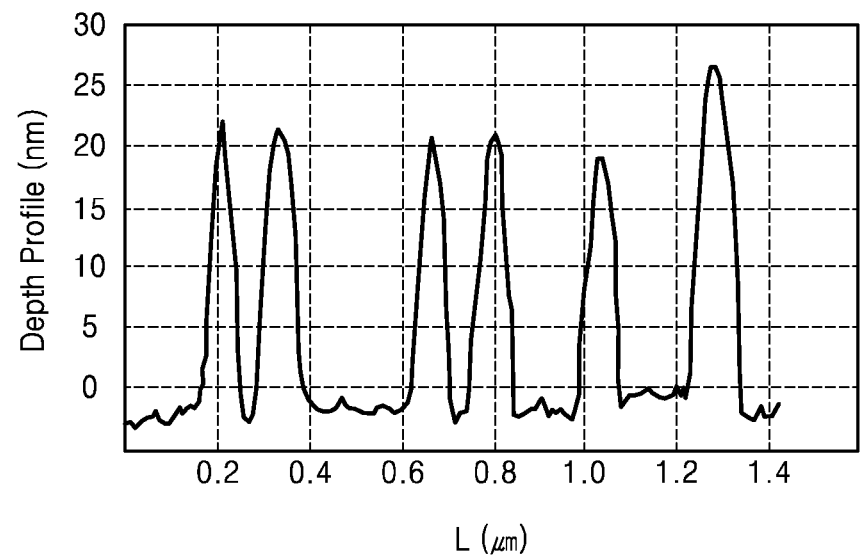
FIG. 2B is a graph showing a depth profile of the nanostructure in an L direction of FIG. 2A.

FIG. 2B is a graph showing a depth profile of the nanostructure in an L direction of FIG. 2A. Referring to FIG. 2B, it is seen that the nanostructures 130 have an average height of approximately 20 nm and have a relatively uniform height.

Figure 3:
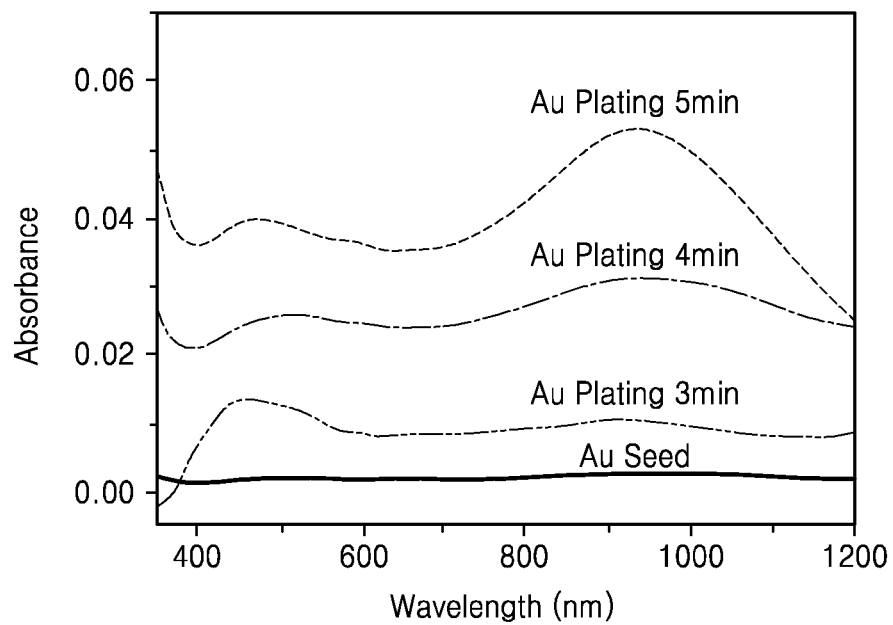
FIG. 3 is a graph showing a surface plasmon band in a process of forming an Au layer as a nanostructure.

FIG. 3 is a graph showing a surface plasmon band generated during a process of forming an Au layer as a nanostructure. Here, when an Au seed having a dot shape was formed on a graphene layer as a nanopattern, the surface plasmon band was measured by using an ultraviolet-visible (UV-VIS) spectrum according to time (3 minutes, 4 minutes, and 5 minutes) of coating Au on a surface of the nanopattern.

Referring to FIG. 3, as the time of coating Au (a second metal) with respect to the Au nanopattern increases from 3 minutes to 4 minutes and then to 5 minutes, it is seen that the degree of optical absorbancy also increases. Specifically, it is confirmed that the optical absorbancy remarkably increases in a mid-IR region, that is, in a wavelength region of 800 nm to 900 nm.

Figure 4:
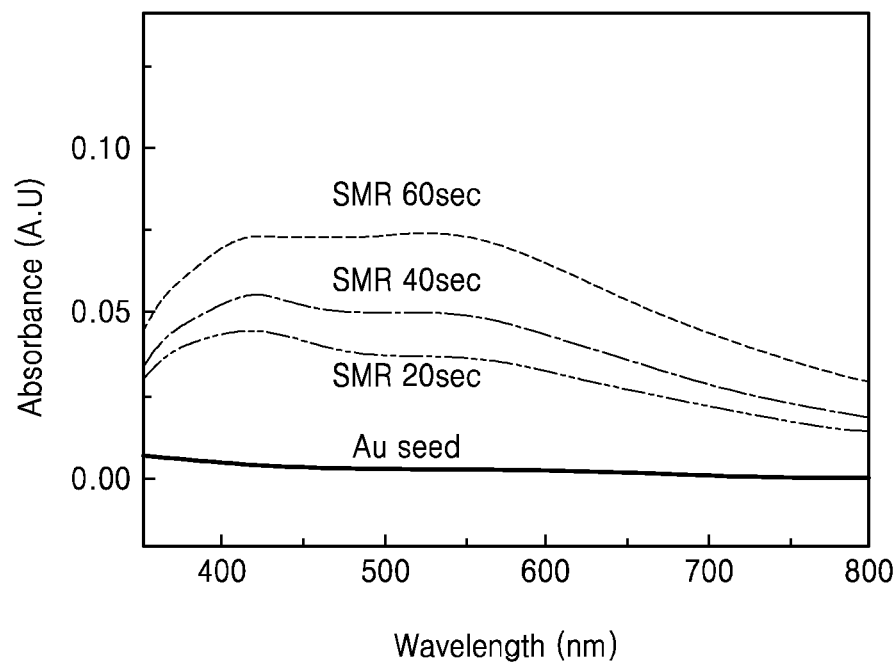
FIG. 4 is a graph showing a surface plasmon band in a process of forming an Ag layer as a nanostructure.

FIG. 4 is a graph showing a surface plasmon band generated during a process of forming an Ag layer as a nanostructure. Here, a specimen to be observed was formed such that, after forming a micelle film by spin coating a polymer solution that was made by dissolving PS-b-P2VP as a block copolymer in O-xylene to a concentration of 0.5% with a spinning speed of 3,000 rpm, and soaking the micelle film in ethanol or methanol for approximately 10 minutes, a film having a porous structure was formed by drying the micelle film. After soaking the film in ethanol solution that included 0.1% $HAuCl_4$ as an Au precursor for approximately 3 minutes, dot shaped Au nanopatterns were formed by performing a hydrogen plasma process. Also, in order to form nanostructures, silver mirror reactions (SMR) were performed for approximately 20 seconds, 40 seconds, and 60 seconds, respectively. The graph in FIG. 4 was obtained by using a UV-VIS spectrum.

Referring to FIG. 4, when Au nanopatterns having a dot shape are only formed on graphene, peaks are very weak or not clearly observed. When Ag is coated on surfaces of the Au nanopatterns, it is confirmed that as the coating time increases, the absorbancy increases at a wavelength range of approximately 400 nm.

Figure 5:
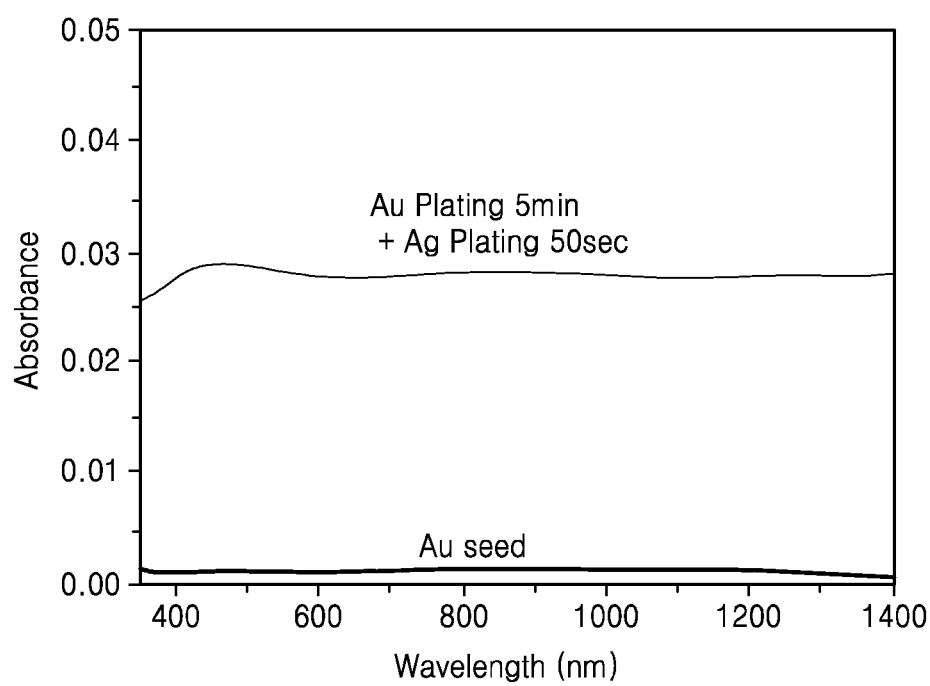
FIG. 5 is a graph showing a surface plasmon band in a process of forming an Au and Ag layer as a nanostructure.

FIG. 5 is a graph showing a surface plasmon band generated during a process of forming an Au and Ag layer as a nanostructure. Here, a specimen to be observed was manufactured as follows. After forming a micelle film by spin coating a polymer solution in which PS-b-P2VP as a block copolymer was dissolved in 0-xylene to a concentration of 0.5% with a spinning speed of 3,000 rpm, the micelle film was soaked in ethanol or methanol for approximately 10 minutes. Afterwards, a film having a porous structure was formed by drying the micelle film. After soaking the film in ethanol solution that included 0.1% $HAuCl_4$ as an Au precursor for approximately 3 minutes, dot shaped Au nanopatterns having a diameter of approximately 100 nm were manufactured by performing a hydrogen plasma process. Afterwards, an Ag coating layer was formed by performing an SMR for approximately 50 seconds. Referring to FIG. 5, it is confirmed that the nanostructures have a uniform optical absorbancy from a UV region to a near infrared ray region.

Figure 6:
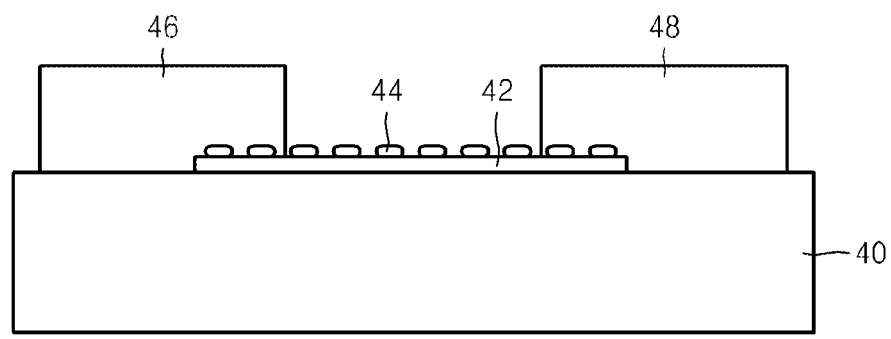
FIG. 6 is a cross-sectional view of nanostructures and an optical device having the nanostructures according to an exemplary embodiment.

FIG. 6 is a cross-sectional view of nanostructures 44 and an optical device having the nanostructures 44 according to an exemplary embodiment. The optical device may be a photodetector, and may be a single band or multi-band plasmonic photodetector.

Referring to FIG. 6, a carbon nanomaterial layer 42 may be formed on a lower structure 40, and the nanostructures 44 may be formed on the carbon nanomaterial layer 42. Also, a first electrode 46 and a second electrode 48 that contact the carbon nanomaterial layer 42 on which the nanostructures 44 are formed may be included in the optical device. Here, the lower structure 40 may be a substrate. The carbon nanomaterial layer 42 may be graphene. The first electrode 46 may be a source and the second electrode 48 may be a drain. A photocurrent that is generated by light irradiated onto the carbon nanomaterial layer 42 and the nanostructures 44 may be detected through the first electrode 46 and the second electrode 48. As depicted in FIGS. 1B and 1C, the nanostructures 44 may include dot shaped nanopatterns formed of a metal, and a metal layer formed of at least one metal may be formed on surfaces of the nanostructures.

Figure 7:
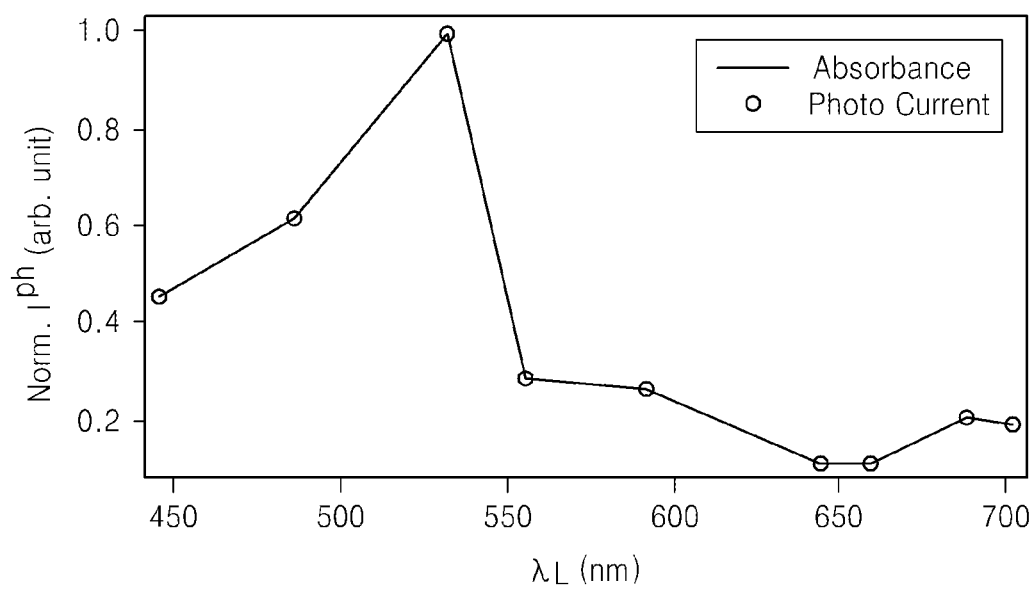
FIG. 7 is a graph showing an absorbance spectrum and a photocurrent of an optical device according to an exemplary embodiment.

FIG. 7 is a graph showing an absorbance spectrum and a photocurrent characteristic of an optical device according to an exemplary embodiment. A photocurrent was measured by irradiating a laser of less than 1 mW to graphene and an electrode junction unit of an optical device according to the current exemplary embodiment. Afterwards, a photocurrent per energy was calculated by dividing laser power. Referring to FIG. 7, it is confirmed that a trend of the photocurrent per energy according to a wavelength is similar to the trend of an absorbance spectrum. As a result, it is seen that a photocurrent is generated by the surface plasmon absorbance in the optical device shown in FIG. 6.

According to the current exemplary embodiment, various types of nanostructures, for example, plasmonic type nanostructures, may be formed on a carbon nanomaterial layer, such as graphene. Also, methods of forming various types of nanostructures on graphene may be provided. Also, according to the current exemplary embodiment, an optical device, for example, an ultra-broadband photodetector that includes nanostructures formed on a carbon nanomaterial layer may be provided. According to the current exemplary embodiment, a multi-band and ultra-broadband plasmonic optical device may be provided.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it should be understood that the exemplary embodiments described therein should be considered in a descriptive sense only and not for purposes of limitation. It will be understood by those of ordinary skill in the art that various changes in form and details may be made therein. For example, it should be understood that the nanopattern material may be various materials other than a metal. The nanostructures according to the current exemplary embodiment may be used with other electronic devices besides the photodetector. Therefore, the scope of the inventive concept is defined not by the detailed description thereof but by the appended claims.

What is claimed is:

1. A nanostructure comprising:
   a carbon nanomaterial layer;
   a nanopattern formed directly on the carbon nanomaterial layer; and
   a metal layer coated on a surface of the nanopattern,
   wherein the nanopattern comprises a plurality of dot-shaped metal particles arranged in a ring shape.

2. The nanostructure of claim 1, wherein the nanostructure has the ring shape.

3. The nanostructure of claim 1, wherein the metal layer connects the dot-shaped metal particles to form the nanostructure in a continuous structure.

4. The nanostructure of claim 1, wherein the nanopattern comprises Au, Ag, Cu, Cr, Pt, Pd, or an alloy of Au, Ag, Cu, Cr, Pt, Pd.

5. The nanostructure of claim 1, wherein the metal layer comprises Au, Ag, Cu, Cr, Pt, Pd, or an alloy of Au, Ag, Cu, Cr, Pt, Pd.

6. The nanostructure of claim 1, wherein the metal layer comprises a plurality of metals.

7. The nanostructures of claim 1, wherein the metal layer comprises a plurality of metal layers formed of different metals on a surface of the nanopattern.

8. An optical device comprising:
   a carbon nanomaterial layer;
   a plurality of nanostructures, each of the nanostructures comprising:
      a nanopattern formed directly on the carbon nanomaterial layer; and
      a metal layer coated on a surface of the nanopattern,
      wherein the nanopattern comprises a plurality of dot-shaped metal particles arranged in a ring shape, and
   a first electrode and a second electrode that contact the carbon nanomaterial layer on which the plurality of nanostructures are formed.

9. The optical device of claim 8, wherein the carbon nanomaterial layer comprises graphene.

10. The optical device of claim 8, wherein each of the plurality of nanostructures has the ring shape.

11. The optical device of claim 8, wherein the metal layer connects the dot-shaped metal particles of each of the plurality of nanopatterns to form each of the plurality of nano structures in a continuous structure.

12. The optical device of claim 8, wherein each of the plurality of nanopatterns comprises Au, Ag, Cu, Cr, Pt, Pd, or an alloy of Au, Ag, Cu, Cr, Pt, Pd.

13. The nanostructures of claim 8, wherein the metal layer comprises Au, Ag, Cu, Cr, Pt, Pd, or an alloy of Au, Ag, Cu, Cr, Pt, Pd.

14. The nanostructures of claim 8, wherein the metal layer comprises a plurality of metal layers formed of different metals on surfaces of the plurality of nanopatterns.

* * * * *